SEMICONDUCTOR VOLTAGE REFERENCE SYSTEM HAVING SUBSTANTIALLY ZERO TEMPERATURE COEFFICIENT

Filed June 20, 1963

INVENTOR.
DONALD C. DICKSON, JR

BY McLaughlin & Cahill

ATTORNEYS 3,268,739

SEMICONDUCTOR VOLTAGE REFERENCE SYSTEM HAVING SUBSTANTIALLY ZERO TEMPERATURE COEFFICIENT

Donald C. Dickson, Jr., Scottsdale, Ariz., assignor to Dickson Electronics Corporation, Scottsdale, Ariz., a corporation of Delaware Filed June 20, 1963, Ser. No. 289,352
3 Claims. (Cl. 307—88.5)

The present invention pertains to voltage reference devices, and more specifically, to voltage reference devices of the semi-conductor type.

The utilization of zener diodes as voltage references is well known in the art. Zener diode devices may be made from a PN junction formed of semi-conductor materials such as germanium or silicon and appropriately doped with elements from the V column of the periodic table (donor impurities) to form an N-type semi-conductor, and doped with a chemical impurity from the III column of the periodic table (acceptor impurity) to form a P-type semi-conductor. The junction of the P and N type semi-conductor forms a junction barrier which possesses the ability to readily conduct electric current in one direction and resist the flow of current in the opposite direction. When the junction is biased in the high impedance direction, the voltage may be increased until the barrier experiences a breakdown and current flows in the reverse or high impedance direction through the diode. This breakdown may be due to either avalanche or zener effect; however, the voltage at breakdown is known as the zener voltage and, in an ideal diode, would remain constant over a wide range of ambient temperature and current. Present zener diodes are subject to impedance variation caused by temperature changes and by changes in the current being carried by the diode.

Accordingly, it is an object of the present invention to provide an ideal voltage reference system having a substantially zero temperature coefficient of breakdown voltage.

It is a further object of the present invention to provide a voltage reference system wherein zener impedance is substantially zero over an operating current range.

It is still another object of the present invention to provide a voltage reference system having less electrical noise superimposed on the breakdown voltage than prior art systems.

It is still another object of the present invention to provide a voltage reference system utilizing minority carrier injection.

Further objects and advantages of the present invention will become apparent to those skilled in the art as the description thereof proceeds.

Briefly, in accordance with one embodiment of the present invention, a voltage reference system is provided having a current source connected across a semi-conductive element. The semi-conductive element includes two barriers the first of which is reverse biased to breakdown by the application of the current source. The second barrier, positioned within a minority carrier diffusion length of the first barrier, is forward biased by the current source and the two barriers intimately interact to provide characteristics that unexpectedly approach ideal diode characteristics.

The present invention may more adequately be described by reference to the following description taken in connection with the accompanying drawings in which.

Figure 1:
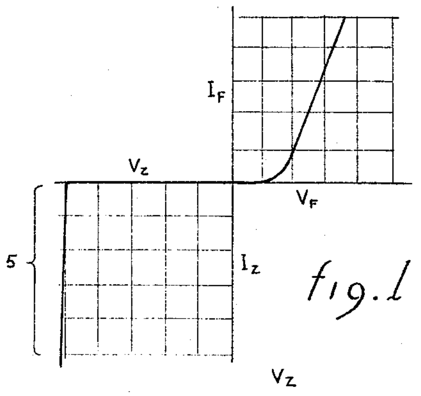
FIG. 1 is a volt-ampere characteristic of a typical zener diode.
Figure 2:
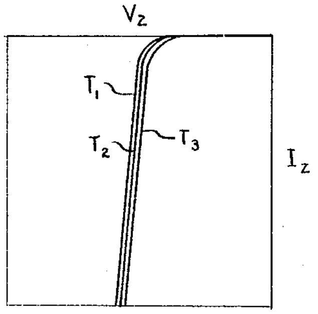
FIG. 2 shows a family of curves for a typical zener diode showing the variation of its characteristic with temperature.

Referring to FIG. 1, a typical zener diode voltage-current characteristic is shown. In the reverse biased condition illustrated for values of $V_z$ and $I_z$, the impedance of the diode remains high until the breakdown voltage is reached whereupon the impedance drops radically. The portion 5 of the characteristic curve includes a finite slope representing a specific "zener impedance." A family of curves showing the negative portion of the curve of FIG. 1 is shown in FIG. 2. Referring to FIG. 2, the plurality of curves shown therein represent the voltage-current characteristic of a typical zener diode for various temperatures $T_1$, $T_2$ and $T_3$. The zener voltage presented by the typical zener diode varies with the temperature as indicated by the three curves of FIG. 2. Thus, for any particular zener current the voltage existing across the barrier will vary through a specific range depending on the temperature. Further, each of the curves exhibits a finite slope representing a specific zener impedance.

Figure 3:
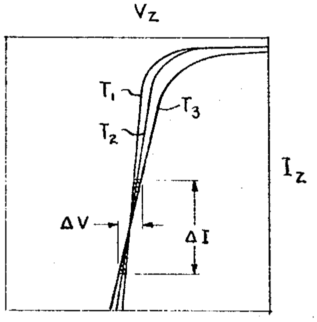
FIG. 3 shows a family of curves illustrating typical characteristics of a temperature compensated zener diode arrangement of the type shown in FIG. 5.
Figure 5:
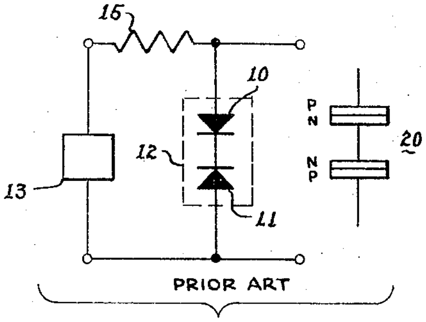
FIG. 5 is a schematic illustration of a prior art temperature compensation scheme for zener diodes.

One method intended to overcome temperature-caused voltage regulation is illustrated in FIG. 5. In FIG. 5 a pair of semiconductor junction devices 10 and 11 have been placed in series and, in some instances, are encapsulated in a single enclosure 12. The assembly is connected to a current source 13 through a current limiting resistor 15. The diode 11 is reverse biased to breakdown; the diode 10 is forward biased. The diodes 10 and 11 are shown schematically at 20 and are illustrated as being PN junctions with the N-type semi-conductor portions in ohmic contact. The diodes are usually chosen to have equal but opposite temperature coefficients. For example, in the case of certain alloy PN junctions the respective diodes may be chosen to have complementary temperature coefficients such as forward biased diode 10 having a —2 millivolt per degree centigrade temperature coefficient while reverse biased diode 11 has a +2 millivolt per degree centrigrade temperature coefficient. The combination of the two diodes thus results in a temperature compensated zener diode arrangement having a reference voltage equal to the zener voltage of the first, plus the forward voltage drop of the second. Typical volt-ampere characteristics for this type of temperature compensated diode are shown in FIG. 3. An inspection of FIG. 3 indicates that for the three temperatures $T_2$, $T_2$, and $T_3$ the zener voltage will remain relatively constant only at a specific current. Thus, to overcome the disadvantages caused by temperature variations, a temperature compensated diode having characteristics similar to those shown in FIG. 3 will be used as a voltage reference with a constant curent source providing a specific zener current. Using this method, voltage variations due to temperature increases or decreases may be minimized;

however, there nevertheless will exist a finite zener impedance at the specific operating current and any deviation in the current provided by the constant current source will result in a deviation of the voltage presented by the zener diode. As an illustration, a deviation of current is indicated as ΔI. The resulting voltage variation caused by ΔI is indicated in FIG. 3 as ΔV. Thus, a ΔI variation in the current supplied by the current source, and a variation in temperature from $T_2$ to $T_3$ will result in a zener voltage presented by the zener diode that varies in the range of ΔV as indicated in FIG. 3 by the shaded portion of the curves.

Figure 4:
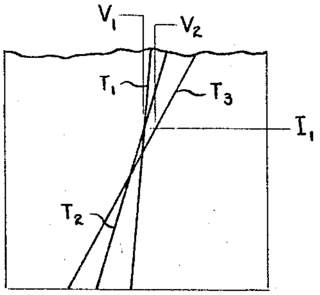
FIG. 4 is an enlarged view of a portion of the curves shown in FIG. 3.

The typical volt-ampere characteristic of a temperature compensated zener diode shown in FIG. 3 is somewhat idealized. The shaded portion of the curves of FIG. 3 is enlarged and shown in FIG. 4. Referring to FIG. 4, it may be seen that the volt-ampere characteristics for the three temperatures do not all coincide at a specific point. Thus, even though there may exist a specific current at which the temperature compensated diode will exhibit the least voltage regulation with temperature change, there will almost always be a slight change in zener voltage with a change in temperature. For example, if the operating current is maintained at $I_1$ as shown in FIG. 4, the voltage will be identical at tempertures $T_1$ and $T_2$. However, if the temperature should exceed $T_2$, then a change in zener voltage will result, and at temperature $T_3$ the voltage will have varied from $V_1$ to $V_2$. Thus, the type of temperature compensation typically found in the prior art does not provide ideal temperature compensation over the entire temperature range $T_1$ to $T_3$; further, an inspection of FIG. 4 reveals an added disadvantage to prior art temperature compensated zener diodes. It can be seen that as the temperature changes, the slope of the volt-ampere characteristic changes thus indicating a variation in the zener impedance with a change in temperautre. Therefore, while reducing the effect of temperature on the zener voltage, prior art temperature compensated zener diodes are subject to variation in zener impedance with changes in temperature.

Figure 6:
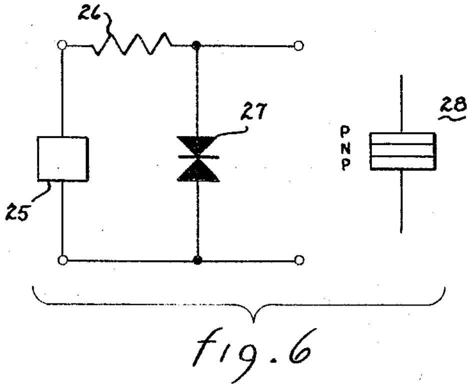
FIG. 6 is a schematic illustration of the ideal voltage reference diode of the present invention.

In contrast to the double diode arrangement shown in FIG. 5, the voltage reference system of the present invention as shown in FIG. 6 comprises a current source 25 connected through a current limitign resistor 26 to a double barrier diode 27. The double barrier diode 27 is shown schematically at 28 as a PNP device. Obviously, the device may be an NPN device and may be constructed utilizing conventional diffusion, alloy, or other well known methods. The device is constructed to have two barriers positioned within a minority carrier diffusion length of each other. The mechanics of PN junctions are well known and will not be discussed here; however, the device of the present invention is not a simple PN device and does not behave as a simple combination of two diodes.

Figure 7:
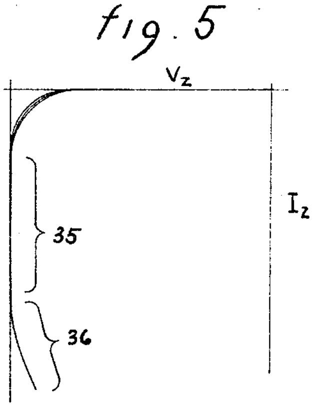
FIG. 7 shows a typical volt-ampere characteristic for a voltage reference system constructed in accordance with the teachings of the present invention.

The reverse biased junction of the diode 27 conducts current when biased past breakdown and may be studied in terms of the usual avalanche breakdown and/or zener breakdown in accordance with known theory. The forward biased junction of the diode 27 results in minoirty carrier injection into the base region which, as stated previously, is of a thickness less than the minority carrier diffusion length. As a consequence, the negative portion of the diode volt-ampere characteristic (FIG. 7) exhibits an unusual property. It may be noted that in the region indicated at 35 the curve becomes substantially vertical thus indicating a small signal zener impedance approaching zero. The zero impedance occurring in this range yields outstanding voltage regulation characteristics since current variations in this impedance range will not affect the zener voltage. The volt-ampere characteristic of the diode of the present invention also exhibits a "folding back" or negative impedance region 36. Diodes exhibiting this small negative impedance may readily be tuned to zero impedance by the addition of a small variable positive resistance external to the device. The minority carrier injection into the region of breakdown of the reverse biased junction has been found to reduce electrical noise which is particularly objectionable in zener diodes of higher voltage ratings. Another important characteristic of the voltage reference diode of my invention is also illustrated in FIG. 7. It may be noted that FIG. 7 represents a family of curves each taken at a different temperature, and all of which show relative temperature insensitivity. The low temperature coefficient, coupled with the zero zener impedance presented by the volt-ampere characteristic, provides a voltage reference diode that gives excellent voltage stability over a wide range of temperatures and may be used with relatively inexpensive and insensitive current sources. Further, the minority carrier injection, with the subsequent reduction of electrical noise, renders the voltage reference system of the present invention more readily applicable to exacting applications.

Figure 8:
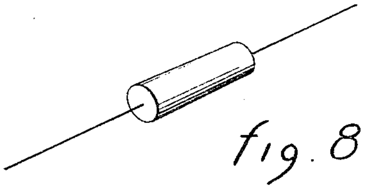
FIG. 8 shows a packaged reference diode, greatly enlarged, constructed in accordance with the teachings of the present invention.

A "packaged" diode, constructed in accordance with the teachings of the present invention, is shown in FIG. 8. The convenience of the double barrier construction is manifest and the simple dual lead structure with no intermediate ohmic contacts lends itself to compact packaging. The diode of the present invention may be constructed from known techniques, and the junctions may be constructed by diffusion, alloying, etc., methods to provide the necessary barriers in accordance with established physical principals. It will be obvious to those skilled in the art that many modifications may be made of the present invention without departing from the spirit and scope thereof. Accordingly, what is claimed as new and desired to secure by Letters Patent of the United States is:

1. A voltage reference system comprising, a first semi-conducting element of a given conductivity type, a second semi-conducting element of said given conductivity type, a third semi-conducting element of the opposite conductivity type joined to said first and second elements to form a first and second barrier, said barriers spaced within a minority carrier diffusion length of each other at the operating temperature of the system, to provide minority carrier injection into the region of breakdown when one of said barriers is reverse biased to breakdown, a current source having first and second terminals, means connecting said first terminal to said first semi-conductor element and said second terminal to said second semi-conductor element for reverse biasing one of said barriers to breakdown said third semi-conducting element being connected with said current source only through said first and second semi-conducting elements.

2. A voltage reference system comprising, a single piece semi-conducting element having two diffused junction barriers therein, said barriers having one conductivity type between them and an opposite conductor type material at the other side said barriers spaced within a minority carrier diffusion length of each other at the operating temperature of the system to provide minority carrier injection into the region of breakdown when one of said barriers is reverse biased to breakdown, a current source connected across said semi-conducting element for forward biasing one of said barriers and reverse biasing one of said barriers to breakdown.

3. A voltage reference diode having a small signal zener impedance of zero comprising, a first semi-conducting element of a given conductivity type, a second semi-conducting element of said given conductivity type, a third semi-conducting element of the opposite conductivity type structurally integral with said first and second elements to form first and second barriers, said barriers spaced within a minority carrier diffusion length of each other at normal operating temperatures to provide minority carrier injection into the region of breakdown when one of said barriers is forward biased and one of said barriers is reverse biased to breakdown, and a first and second ohmic contact joining said first and second elements to a pair of conductors respectively to cause current from a source to pass through both of said barriers.

References Cited by the Examiner

UNITED STATES PATENTS

| | | | |
|---|---|---|---|
| 2,893,904 | 7/1959 | Dickson | 317—235 |
| 2,923,868 | 2/1960 | Giacoletto | 317—234 |
| 2,937,963 | 5/1960 | Pelfray | 317—234 |
| 2,975,342 | 3/1961 | Rediker | 307—88.5 |
| 3,054,033 | 9/1962 | Iwana et al. | 317—234 |
| 3,140,438 | 7/1964 | Shockley et al. | 317—235 |
| 3,156,861 | 11/1964 | Dickson | 317—234 |
| 3,196,329 | 7/1965 | Cook et al. | 307—88.5 |

FOREIGN PATENTS 1,193,794 5/1959 France.

JOHN W. HUCKERT, *Primary Examiner.*

ARTHUR GAUSS, *Examiner.*

J. D. CRAIG. *Assistant Examiner.*